United States Patent
Fischer et al.

(10) Patent No.: US 9,660,206 B2
(45) Date of Patent: *May 23, 2017

(54) VERTICAL ORGANIC TRANSISTOR AND PRODUCTION METHOD

(71) Applicant: Novaled GmbH, Dresden (DE)

(72) Inventors: Axel Fischer, Dresden (DE); Karl Leo, Dresden (DE); Bjoern Luessem, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/852,134

(22) Filed: Mar. 28, 2013

(65) Prior Publication Data

US 2013/0277651 A1 Oct. 24, 2013

(30) Foreign Application Priority Data

Apr. 3, 2012 (DE) .................. 10 2012 102 910

(51) Int. Cl.
| | |
|---|---|
| H01L 51/00 | (2006.01) |
| H01L 31/00 | (2006.01) |
| H01L 29/06 | (2006.01) |
| H01L 51/05 | (2006.01) |
| H01L 51/10 | (2006.01) |

(52) U.S. Cl.
CPC .......... *H01L 51/057* (2013.01); *H01L 51/002* (2013.01); *H01L 51/105* (2013.01)

(58) Field of Classification Search
CPC ............................... H01L 51/52; H01L 33/06
USPC .......................... 257/40, 98, 13, 59; 438/778
See application file for complete search history.

(56) References Cited

U.S. PATENT DOCUMENTS

| | | | |
|---|---|---|---|
| 6,774,052 B2 | 8/2004 | Vogeli et al. | |
| 6,884,093 B2 | 4/2005 | Baldo et al. | |
| 2005/0189875 A1* | 9/2005 | Nakada | 313/504 |
| 2005/0221121 A1* | 10/2005 | Ishihara et al. | 428/690 |
| 2006/0214570 A1* | 9/2006 | Malliaras | H01L 27/3209 313/506 |

(Continued)

OTHER PUBLICATIONS

Chao et al., "Polymer Space-Charge-Limited Transistor as a Solid-State Vacuum Tube Triode," Applied Physics Letters, 2010, 97:223307-1-223307-3.

(Continued)

*Primary Examiner* — Yuanda Zhang
*Assistant Examiner* — Sheikh Maruf
(74) *Attorney, Agent, or Firm* — Eversheds Sutherland (US) LLP

(57) ABSTRACT

The invention relates to a vertical organic transistor on a substrate having an electrode, a counter electrode and a layer arrangement which is arranged between the electrode and the counter electrode, wherein the layer arrangement is formed with the following layers: a central electrode, an organic layer made up of organic semiconductor material which is arranged between the central electrode and the electrode, a further organic layer made up of organic semiconductor material, which is arranged between the central electrode and the counter electrode, and a doping layer which is arranged between the central electrode and the electrode. Furthermore, the invention relates to a method for producing a vertical organic transistor.

8 Claims, 3 Drawing Sheets

(56) References Cited

U.S. PATENT DOCUMENTS

| | | | |
|---|---|---|---|
| 2006/0261337 A1* | 11/2006 | Koma | G02F 1/133603 257/59 |
| 2008/0197765 A1* | 8/2008 | Sung | 313/503 |
| 2009/0103281 A1* | 4/2009 | Koh | 362/97.1 |
| 2009/0108749 A1 | 4/2009 | Yokoyama et al. | |
| 2009/0160323 A1* | 6/2009 | Nomura | C07D 209/86 313/504 |
| 2009/0230856 A1* | 9/2009 | Tsutsui et al. | 313/504 |
| 2009/0261354 A1* | 10/2009 | Ha et al. | 257/87 |
| 2009/0315025 A1* | 12/2009 | Kitamura | C07D 471/06 257/40 |
| 2010/0133517 A1* | 6/2010 | Lee et al. | 257/40 |
| 2010/0157585 A1* | 6/2010 | Diekmann et al. | 362/228 |
| 2010/0213447 A1 | 8/2010 | Fujimoto et al. | |
| 2012/0168801 A1* | 7/2012 | Xuan et al. | 257/98 |
| 2012/0223298 A1* | 9/2012 | Osaka | C07C 211/54 257/40 |
| 2012/0299470 A1* | 11/2012 | Kobayashi et al. | 313/504 |
| 2013/0015448 A1* | 1/2013 | Yang et al. | 257/59 |
| 2013/0181208 A1* | 7/2013 | Guo | 257/40 |
| 2013/0214260 A1* | 8/2013 | Kadoma | H01L 51/0067 257/40 |
| 2013/0240821 A1* | 9/2013 | Toh | H01L 27/249 257/4 |
| 2014/0014937 A1* | 1/2014 | Ide et al. | 257/40 |
| 2014/0034924 A1* | 2/2014 | Kawata | H01L 51/0072 257/40 |
| 2014/0106523 A1* | 4/2014 | Koldiaev | H01L 21/845 438/212 |
| 2015/0075283 A1* | 3/2015 | Che | B81C 1/00531 73/514.32 |

OTHER PUBLICATIONS

Cheng et al., "Using Metal/Organic Junction Engineering to Prepare an Efficient Organic Base-Modulation Triode and its Inverter," Organic Electronics, 2009, 10:1636-1640.

Fujimoto et al., "Fabrication of a Vertical-Type Organic Transistor with a Planar Metal Base," Applied Physics Letters, 2005, 87:133503-1 to 133503-3.

Kim et al., "Holography and Plasma Oxidation for Uniform Nanoscale Two Dimensional Channel Formation of Vertical Organic Field-Effect Transistors with Suppressed Gate Leakage Current," Organic Electronics, 2011, 12:1841-1845.

Nakayama et al., "High-Current and Low-Voltage Operation of Metal-Base Organic Transistors with LiF/Al Emitter," Applied Physics Letters, 2006, 88:153512-1 to 153512-3.

Watanabe et al., "Improvement in On/Off Ratio of Pentacene Static Induction Transistors with Ultrathin CuPc Layer," Japanese Journal of Applied Physics, 2006, 45(4B):3698-3703.

Yang et al., "A New Architecture for Polymer Transistors," Nature, 1994, 372:344-346.

Zhao et al., "Fabrication and Characteristics of Permeable-Base Organic Transistors Based on Co-Evaporated Pentacene:Al Base," Organic Electronics, 2011, 12:1003-1009.

* cited by examiner

VERTICAL ORGANIC TRANSISTOR AND PRODUCTION METHOD

CROSS-REFERENCE TO RELATED APPLICATIONS

This application hereby claims priority to German Patent Application No. 10 2012 102 910.5, filed 3 Apr. 2012, the disclosure of which is expressly incorporated herein by reference.

FIELD OF THE INVENTION

The invention relates to a vertical organic transistor and also a production method.

BACKGROUND OF THE INVENTION

Vertical organic transistors are semiconductor components with three electrodes. Organic molecules, carbon compounds and also polymers are in particular used as semiconducting layers. The component has a plurality of planar layers lying one above the other, which are manufactured on a substrate. As the currents in the component flow perpendicularly to the functional layers and thus also to the substrate, it is termed a vertical component.

The following tasks or functions are intended for the vertical organic transistor: Amplifying currents and/or voltages, electrical switches in order to control the current flow through downstream components, carrying out a logical operation in combination with a plurality of components and a very wide range of tasks of analogue signal processing.

One advantage of organic transistors with vertical current flow lies in the small length between the electrodes which can be set very precisely by means of the vapour deposition of materials in a vacuum. As a result, the time which a charge carrier requires for traversing the organic semiconductor is reduced. High switching speeds thus result, which are required for example for the active control of screens with organic light emitting diodes (OLEDs).

In addition, due to the small dimensions of a few 100 nanometres, even at small voltages, which typically lie below 5 V, very high electrical fields are achieved. High current densities are created in the component as a result of this, in order to bring a downstream OLED to an application-relevant brightness. Furthermore, OLEDs are likewise constructed such that the currents flow vertically to the substrate. OLEDs and vertical organic transistors are of the same architecture and therefore suitable to be processed on top of one another in one production process. This leads to a higher packing density and a higher proportion of the surface of a screen which can contribute to the emission of information.

A vertical organic transistor is known from the document US 2010/0213447 A1, in which a central electrode is formed as a continuous layered body which contains an insulating metal compound and metal particles which are distributed in the insulating compound.

An organic semiconductor component is disclosed in the document U.S. Pat. No. 6,884,093 B2, in which a central electrode is formed in an organic layered arrangement with a conductive lattice material.

A method for producing a permeable base transistor is described in the document U.S. Pat. No. 6,774,052 B2, in which a base layer is deposited on a semiconductor substrate and a semiconductor layer grows on the base layer, wherein the base layer comprises metallic nanotubes.

Vertical organic transistors are furthermore known per se for example from the following documents: Nakayama et al., Appl. Phys. Lett., 2006, 88, Cheng et al., Org. Electron., 2009, 10, Watanabe et al., Jpn. J. Appl. Phys., 2006, 45, Fujimoto et al., Appl. Phys. Lett., 2005, 87.

BRIEF SUMMARY

It is the object of the invention to specify a vertical organic transistor with improved operating characteristics and also a production method. In particular, at least one of the following operating characteristics should be optimised: current in the on-state of the transistor, operating voltage, current amplification, voltage amplification and also on/off ratio.

This object is achieved by a vertical organic transistor on a substrate having an electrode (121), a counter electrode (123) and a layer arrangement which is arranged between the electrode (121) and the counter electrode (123), wherein the layer arrangement is formed with the following layers: a central electrode (122), which is realised to allow a passage of electrical charge carriers through the central electrode (122), which are injected from the electrode (121) into the layer arrangement, so that the injected electrical charge carriers can be transported from the electrode (121) through the layer arrangement to the counter electrode, an organic layer (131) made up of organic semiconductor material which is arranged between the central electrode (122) and the electrode (121), a further organic layer (132) made up of organic semiconductor material, which is arranged between the central electrode (122) and the counter electrode (123), and a doping layer (141) which is arranged between the central electrode (122) and the electrode (121). Furthermore provided is a method for producing a vertical organic transistor in which an electrode (121), a counter electrode (123) and a layer arrangement, which is arranged between the electrode (121) and the counter electrode (123), are produced on a substrate, and in which the layer arrangement is formed with the following layers: a central electrode (122), which is realised to allow a passage of electrical charge carriers through the central electrode (122), which are injected from the electrode (121) into the layer arrangement, so that the injected electrical charge carriers can be transported from the electrode (121) through the layer arrangement to the counter electrode, an organic layer (131) made up of organic semiconductor material which is arranged between the central electrode (122) and the electrode (121), a further organic layer (132) made up of organic semiconductor material, which is arranged between the central electrode (122) and the counter electrode (123), and a doping layer (141) which is arranged between the central electrode (122) and the electrode (121).

BRIEF DESCRIPTION OF THE DRAWINGS

The invention is explained in more detail in the following on the basis of exemplary embodiments with reference to figures of a drawing. In the figures.

DETAILED DESCRIPTION

Figure 1:
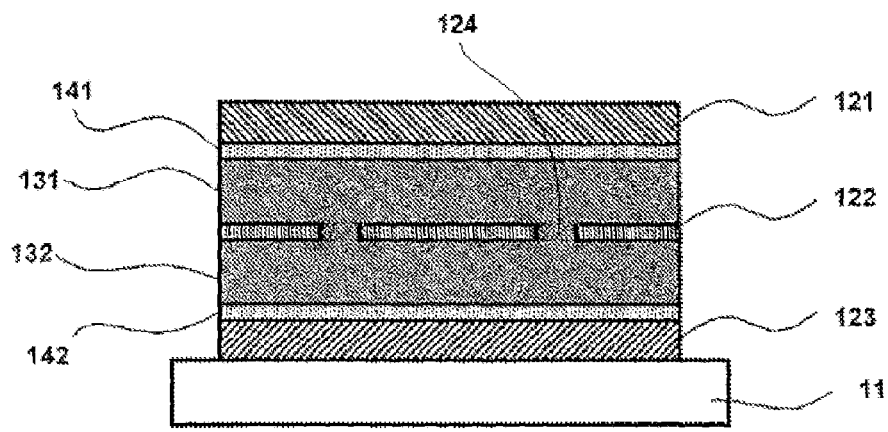
FIG. 1 shows a schematic illustration of a stack of layers of a vertical organic transistor in cross section.

The invention comprises the idea of a vertical organic transistor which has an electrode, a counter electrode and also a layer arrangement, which is arranged between the electrode and the counter electrode, on a substrate. The layer arrangement for its part comprises a plurality of layers, to which a central electrode belongs. Furthermore, the layer arrangement comprises an organic layer made up of organic semiconductor material which is arranged between the central electrode and the electrode, and also a further organic layer made up of organic semiconductor material, which is arranged between the central electrode and the counter electrode. And furthermore, the layer arrangement has a doping layer which is arranged between the central electrode and the electrode.

The central electrode is accommodated as a layer in the layer arrangement, thus forms a flat electrode, just like the electrode and the counter electrode, which together with the layer arrangement are part of a stack of layers which are formed on the substrate. The central electrode is produced such that it allows a passage of electrical charge carriers through the central electrode, which are injected during operation, that is to say when applying electrical potentials to the electrode and the counter electrode, from the electrode into the layer arrangement, so that the injected electrical charge carriers, driven by the electrical potentials applied to the electrode and the counter electrode, can be transported from the electrode in the layer arrangement to the counter electrode. The electrode injecting the electrical charge carriers into the layer arrangement thus forms an emitter electrode during operation, from which the injected electrical charge carriers make it through the layer arrangement, in particular also the central electrode, to the counter electrode in the course of a current flow, which in this respect then forms a collector electrode. The central electrode is also termed the base electrode. The current flow between the emitter electrode and the collector electrode can be controlled by applying an electrical potential to the central electrode.

The characteristic of the central electrode of allowing through the electrical charge carriers injected from the electrode into the layer arrangement so that the same can reach the counter electrode in practice means that transport or transmission channels are formed through the central electrode, through which channels the electrical charge carriers make it from the one side of the central electrode to the opposite side of the central electrode without "being captured" by material of the central electrode. Physically this means that the injected electrical charge carriers do not energetically relax to the Fermi level of the central electrode.

The provided doping does not lead to higher currents, but rather also to a higher amplification of the currents in the vertical organic transistor. The use of electrical doping furthermore leads to an increase of the amplification of the voltage on account of the better so-called subthreshold swing (voltage per increase in current in decades). This improvement can substantially be traced back to the effect that by means of doping, the active surface better proves its worth compared to inactive surfaces. In one configuration, the doping layer on the collector electrode can likewise lead to an increase of the current amplification. Furthermore, the doping layer can be used on the collector in one design, in order to maintain the current amplification even at high current densities in the on state.

A preferred development of the invention provides that the doping layer is arranged between the electrode and the organic layer. In this context, provision may be made for the doping layer to be in direct contact, that is to say touch contact, with the electrode, particularly if the electrode should operate as emitter electrode during operation due to a selectable configuration of the applied electrical potentials. The suggested embodiment can however also be provided if the counter electrode operates as emitter electrode during operation.

In an expedient configuration of the invention, provision can be made for a further doping layer to be provided, which is arranged between the central electrode and the counter electrode. This provision is in particular made if the counter electrode acts as an emitter electrode during operation.

An advantageous embodiment of the invention provides that the further doping layer is arranged between the counter electrode and the further organic layer. In this embodiment also, provision can be made in one design for the further doping layer to be in direct contact, that is to say touch contact, with the counter electrode.

Preferably, a development of the invention provides that the doping layer and/or the further doping layer are formed as an electrically doped layer, in which an electrical dopant is embedded into a matrix material. As a result, a possible embodiment of the doping layer and/or the further doping layer is created, in which an electrical dopant, whether it be an n- or a p-dopant, is embedded into an assigned matrix material in such a manner that the matrix material is electrically doped in that a partial charge transfer takes place between the electrical dopant and the molecules of the matrix material, so that the density of the free charge carriers in the respective layer is increased. This corresponds to an electrical doping of the respective matrix material. The molecular dopants preferably have a molecular weight of >200 g/mol. Oxidic dopants can be used in one embodiment.

In an advantageous configuration of the invention, provision can be made for the doping layer and/or the further doping layer to be formed as a dopant layer made up of a doping material, wherein the doping material is an electrical dopant for the organic semiconductor material of the organic layer in the case of the doping layer and an electrical dopant for the organic semiconductor material of the further organic layer in the case of the further doping layer. As a result, a further embodiment of the doping layer and/or the further doping layer is created, in which the respective layer itself consists of an electrical dopant, whether it be an n- or a p-dopant, which is an electrical doping material for the adjacent layer made up of organic semiconductor material, namely the organic layer or the further organic layer. At least in the boundary surface region between the layer made up of the doping material and the in each case adjacent organic layer made up of organic semiconductor material, an electrical doping action then occurs, as has already been described in general above. The doping material and the assigned organic semiconductor material form a dopant/matrix system, such that the embedding or imbedding of the electrical doping material into the matrix material leads to an electrical doping of the molecules of the matrix material, as a result of which a partial charge transfer of the molecules of the doping material and the molecules of the matrix material takes place. Provision can be made for the dopant layer to be formed with a layer thickness of approximately 2 nm to approximately 3 nm for forming a boundary surface doping.

A development of the invention can provide that the doping layer and the further doping layer differ with respect to at least one of the following layer properties: layer thickness, spacing between a layer edge facing the central electrode and an opposite layer edge of the central electrode, doping profile and material composition. The different construction of doping layer and the further doping layer with respect to at least one of the previously mentioned features leads to a type of "unsymmetrical" construction of both doping layers. In one embodiment, provision can for example be made for the doping layer to be realised as an electrically doped layer and the further doping layer to be realised as a dopant layer or vice versa. As one diode of the vertical organic transistor is used in the forward direction (emitter) and one diode is used in the reverse direction (collector), different overall layer thicknesses can be provided for the emitter layers and the collector layers. In one configuration, an intrinsic emitter layer is more thin, wherein short circuits are to be avoided, and the collector layer is more thick, as in the case of a constant operating voltage the electric field as a result becomes lower, as do return currents from the base to the collector, which are responsible for the currents in the off state.

A preferred development of the invention provides that at least one of the following layers is realised in a multilayered manner: organic layer, further organic layer, doping layer and further doping layer. In one configuration, provision can be made for a plurality of doping layers to be provided between the electrode and the central electrode, of which in one possible configuration, one of the doping layers is realised as an electrically doped layer and one other of the doping layers is realised as a dopant layer. Additionally or alternatively, one such configuration for the further doping layer can be provided between the central electrode and the counter electrode.

In an expedient configuration of the invention, provision can be made for the central electrode to have one or a plurality of openings, through which a touch contact is formed between one region of the layer arrangement on one side of the central electrode and one region of the layer arrangement on an opposite side of the central electrode. In this manner, a preferred design for the central electrode, which during operation acts as base electrode, is created such that a direct touch contact results between the regions of the layer arrangement on the two sides of the central electrode through the one or the plurality of openings. Alternatively or additionally, provision can also be made for the transmission or the passage of the charge carriers injected from the electrode into the layer arrangement to take place through transmission or passage regions of the central electrode, in which the layer arrangement regions are not in touch contact on both sides of the central electrode, wherein in spite of this, a passage (transmission) of the charge carriers takes place so that these can finally reach the counter electrode. In one embodiment, touch contact is formed between the organic layer and the further organic layer.

Provision can be made for the doped layer and the central electrode to be separated by means of an intrinsic layer. Furthermore, provision can be made for the thickness of the doping layer to be larger than the diffusion length of the charge carriers, so that in the off state, charge carriers cannot diffuse and transmit to the central electrode. This would lead to currents which flow in the off state and thus impair the on/off ratio.

The doping layer can have a layer thickness such that the injection is ensured, but the quantity of free charge carriers is low, in order in the off state to keep the transmission of these free charge carriers minimal. This can also be set via the doping concentration, wherein too high a doping (>10 mol %) should be avoided.

In order to support the diffusion of charge carriers from the emitter layer to the collector layer via openings, the charge carrier concentration is high within the emitter layer and low within the collector layer. To this end, the doping is set in such a manner with respect to the doping concentration and layer thickness on the collector side that no free charge carriers are located in the vicinity of the central electrode on the side of the collector layer.

In one configuration, the organic layer and the doping layer are formed with the same organic matrix material. Alternatively or additionally, the further organic layer and the further doping layer are the same organic matrix material. In one design, the organic layer and the doping layer are formed with different organic matrix materials. Alternatively or additionally, the organic matrix material of the doping layer is essentially an amorphic material. Preferably, the matrix material of the doping layer is a semiconductor from the class of diamines, which transports organic holes. One possible example for this is N,N'-bis(naphthalen-1-yl)-N,N'-bis(phenyl)-benzidine.

The preceding statements about advantageous configurations apply accordingly in connection with the method for producing a vertical organic transistor. So, for example, provision can be made for the central electrode to be produced with one or a plurality of openings, through which regions of the layer arrangement touch one another on both sides of the central electrode. However, other configurations of the central electrode can also be produced in the method.

The property of the central electrode to have openings which allow the direct contact of layer regions on both sides of the central electrode can be produced by means of various methods which are known per se in various configurations. In the following, a few advantageously usable technologies for producing the central electrode are explained.

a) Vapour Deposition of Metals onto the Molecule Layer in a Vacuum.

In the case of a suitable combination of a metal, which is vapour-deposited, and an already-applied molecule layer, a growth of the metal may occur on the molecule layer, which is not completely covering. This is the case in particular if the metal layer is particularly thin. For example, the metal layer can for example be approximately 10 nm to approximately 15 nm thick. The metal layer may however also be applied more thinly or more thickly. In addition, the creation of openings in the metal contact is supported by means of rough molecule layers and also the use of metals which do not wet the molecule layer. The metal layer with openings can then be used as base electrode.

b) Co-Vaporisation of Metal and Molecules.

In the case of a simultaneous vaporisation of molecules and metals, irregularities may arise during the growth of the layer, so that openings are created in the layer. The co-vaporised layer remains electrically conductive and for the most part metallic. Typically approximately 10% of the layer thickness is introduced here as molecules. However, higher or lower concentrations of molecules are also possible in the co-vaporised layer. The co-vaporised layer is therefore a conductive electrode with openings which can be used as base electrode (cf. for example Zhao et al., Org. Electron., 2011, 12).

c) Use of CNTs (Carbon Nanotubes) in the Central Electrode.

CNTs can form a conductive network when applied as a layer. Open spaces are located between the individual CNTs, which can be regarded as openings. CNT electrodes can for example be produced from a solution. Thus, CNT electrodes can be used as base electrode (cf. for example U.S. Pat. No. 6,774,052 B2).

d) Structuring a Metal Contact by Means of Polystyrene Balls.

By applying polyester balls onto a molecular layer, regions of the molecular layer which are wetted with metal can selectively be defined during the subsequent vapour deposition of a metal electrode. Following a step in which the polyester balls are removed, a metal electrode with openings remains. The openings are located at the points at which the polyester balls were located on the molecule layer. The diameter of the openings is typically in the range from 100 nm to 200 nm. However, larger and smaller openings can also be created. Thus, the metal electrode can be used as a base electrode (cf. for example Chao et al., Appl. Phys. Lett., AIP, 2010, 97).

e) Use of Lithographic Methods.

By using lithographic methods, structures can be created in a targeted fashion, which create a metal electrode with openings. In lithography, regions are selectively structured by means of illumination by means of functional layers and solvent. Holographically generated spatial variations of laser light can be used for example as light source. Thus, a metal electrode with openings is created, which can be used as base electrode (cf. for example Kim et al., Org. Electron., 2011, 12).

f) Structuring of a Grid Electrode by Means of Shadow Masks.

When vaporising a metal by means of a shadow mask, regions of a sample can be covered in a targeted fashion. Typically, strip-shaped electrodes are used for this. The intermediate spaces of the strips can function as openings. The metallic grid electrode can then be used as base electrode. By means of a suitable spatial arrangement of material vaporiser and shadow mask with respect to the substrate, various ratios between metallic strips and intermediate spaces can be set (cf. for example Watanabe et al., Jpn. J. Appl. Phys., 2006, 45).

g) Use of Polymer Films.

Polymer films have likewise been successfully used as base electrode. These can for example be created by means of spin coating. When choosing a suitable polymer, a conductive network can be produced after the production of the electrode, which can be used as base electrode (cf. for example Yang et al., Nature, 1994, 372).

The previous methods are examples. However, other methods for producing the central electrode (base electrode) can also be used (cf. for example U.S. Pat. No. 6,884,093 B2).

In the following, further embodiments are explained in connection with the suggested vertical organic transistor.

An advantageous design provides that the doping layer and/or the further doping layer are free of a lateral structuring. In contrast with the use of doping in connection with the source and the drain contact of an organic field effect transistor, where such a lateral structuring is necessary, it was found that in the case of the technologies suggested here, it is possible to optionally dispense therewith.

An expedient design provides that materials with high charge carrier mobility, which preferably lies above 0.1 $cm^2/Vs$, are used as molecule for the organic layer and/or the further organic layer. The materials C60 and pentacene are for example particularly suitable therefor.

Provision can be made, if the vertical organic transistor is of the hole-conducting type, for F6-TCNNQ, 2,2',2"-(cyclopropane-1,2,3-triylidene)tris(2-(2,3,5,6-tetrafluoro-4-(trifluoromethyl)phenyl)-acetonitrile), 2,2',2"-(cyclopropane-1,2,3-triylidene)tris(2-(p-cyanotetrafluorophenyl) acetonitrile), F4-TCNQ, MoO3 or similar materials, which have the property of having free energetic states at room temperature which lie in the region of the hole-conducting transport level of the matrix material, are used as p-doping materials.

An advantageous design provides that, if the vertical organic transistor is of the electron-conducting type, W2(hpp)4, Cr2(hpp)4, Cs, N1,N4-bis(triphenylphosphoranylidene)benzene-1,4-diamine or similar materials, which have the property of having occupied energetic states at room temperature which lie in the region of the electron-conducting transport level of the matrix material, are used as n-doping materials.

An advantageous design can provide that a doping concentration in the doping layer and/or the further doping layer is approximately 2% by weight. Depending on requirements and desired charge carrier density, the doping concentration can lie below approximately 0.1% by weight in order to completely safeguard the depletion of the layer for suitable choice of the potentials at the electrodes. In another design, the doping concentration can lie above approximately 10% by weight, in order to support the accumulation of charge carriers in the layer, if for example the transmission of charge carriers through the central electrode benefits thereby.

An advantageous design provides that the same material, of which the organic layer/the further organic layer consists, is used as matrix material of the doping layer and/or the further doping layer.

A development of the invention can provide that a layer thickness of the doping layer and a layer thickness of the organic layer and/or a layer thickness of the further doping layer and a layer thickness of the further organic layer are configured to set a voltage difference between the electrode/counter electrode and the central electrode to a value, from which the collector current starts to rise. Depending on whether this voltage in an emitter circuit is smaller or larger than 0 V, the transistor can usually be set usually off or usually on in terms of functional properties.

An expedient configuration can provide that the layer thickness of the doping layer is 20 nm and the overall layer thickness of the doping layer and the organic layer (emitter layer if it is arranged adjacently to the emitter electrode) together is approximately 70 nm. A reduction of the layer thickness of doping layer and organic layer to less than 30 nm is possible if it is ensured by means of the manufacturing process that a contact of adjacent electrodes can be excluded. An increase of the layer thickness of doping layer and organic layer to more than 200 nm is conceivable if for example charge carriers can more likely reach openings of the central electrode as a result. The previously mentioned designs apply for the further doping layer and the further organic layer accordingly.

A development can provide for the layer thickness of the doping layer and the layer thickness of the further organic layer to be suitable to set a voltage difference between central electrode and counter electrode, at which a large portion of the charge carriers make it through the central electrode. In the optimum case, this voltage is negative. Then, virtually all charge carriers are transmitted through the central electrode without an additional voltage having to be present between the central electrode and counter electrode (collector electrode).

An expedient configuration can provide that the layer thickness of the doping layer is 20 nm and the overall layer thickness of the doping layer and the organic layer (collector layer if it is arranged adjacently to the collector electrode) together is approximately 70 nm. A reduction of collector layer of doping layer and collector layer to less than 30 nm is possible if it is ensured by means of the manufacturing process that a physical contact of the adjacent electrodes can be excluded and as a result, the voltage between central electrode and collector electrode, which is necessary for causing virtually all charge carriers to transmit, is dropped. An increase of the layer thickness of doping layer and collector layer to more than 200 nm is conceivable if for example the voltage between base electrode and collector electrode, which is necessary for causing virtually all charge carriers to transmit, is not substantially increased. As a result, however, the currents which are injected directly at the base electrode and flow to the collector electrode can be lowered considerably.

An expedient configuration can provide that the doping layers are air stable or, following air contact by means of a heating step, can be returned toe their original action/properties.

An expedient configuration can provide that the doping layer and/or the further doping layer are realised in a temperature-stable manner, such that without damage they withstand a heating step, which is necessary for improving the characteristic values of the vertical organic transistor, particularly at temperatures of more than 150° C.

A very wide range of characteristic values of a vertical organic transistor can be positively influenced by means of the previously mentioned technologies, particularly by means of the provision of the doping layer and/or the further doping layer. For example, these include the following properties:

Current density in the on state: By means of the improved injection of charge carriers with the aid of the doping layer(s) in the vicinity of the electrode used as emitter, a lower voltage is consumed at the injected contact. Thus, higher current densities can be achieved at the same operating voltage.

Operating voltage: Conversely to the previous point, lower operating voltages are required for the same current density with the aid of the doping layer(s) in the vicinity of the electrode used as emitter.

On/off ratio: As the off state of a vertical organic transistor is not reduced on account of the doping layer(s), neither by insertion in the vicinity of the electrode used as emitter nor in the vicinity of the electrode used as collector, the on/off ratio is increased due to the increase of the on state.

Voltage amplification: Vertical organic transistors can amplify voltages as a constituent of a voltage divider. Decisive for the amplification of voltages is the degree to which the resistance of the vertical organic transistor is changed with a variation of the voltage at the central electrode. By inserting the doping layer(s) at the electrode used as emitter, the collector current increases more steeply. Consequently, the voltage amplification is increased.

Current amplification: Due to the effect of the engagement of the reaching of the electrical field, the collector potential has an influence on the currents at the emitter contact. The better is the injection at the emitter, the more current can be adjusted at the emitter if an additional electrical field of the collector is present at the emitter. Consequently, the current densities within the active surface are increased. In the surfaces (cf. FIG. 2) there is no reaching through,as in each case only two electrodes overlap. Doping layers which are inserted in the vicinity of the electrode used as emitter can thus increase the current density within the active surface compared to the inactive surface. Thus, the currents in the inactive regions carry less weight and the transmission factor is increased. Consequently, the current amplification is also increased.

Further advantages, particularly with regards to current amplification and/or the operating voltage, can be achieved if one or a plurality of doping layers are inserted in the vicinity of the electrode used as collector.

Current amplification: Between the central electrode and the electrode which is used as collector, the additional doping layer in the vicinity of the collector contact in combination with an intrinsic layer in the vicinity of the central electrode can generate an integral voltage. The process is to be traced back to the redistribution of free charge carriers of the doping layer. This integral voltage is especially orientated such that charge carriers which have been transmitted are effectively guided to the collector. As a result, the transmission factor and thus the current amplification are increased. This advantage leads in particular to the current amplification dropping out higher in the on state.

Operating voltage: Furthermore, the integral voltage can be used so that a lower operating voltage is needed in the case of constant current amplification.

FIG. 1 shows a schematic illustration of a stack of layers of a vertical organic transistor in cross section.

In the design shown by way of example, the vertical organic transistor has three metallic and/or highly electrically conductive electrodes, namely an electrode 121, a central electrode 122 and a counter electrode 123, which for example consists of Au, Al, Cu, Ag, Ca or a conductive transparent oxide such as ITO. However, a conductive polymer such as for example PEDOT:PSS can be used for constructing the electrodes. Nanostructures, such as silver nanowires or CNTs ("carbon nanotubes") can also be used. Graphene can likewise be used as electrode material on account of its very high conductivity.

The three electrodes 121, 122, 123 can be understood as parallel and planar electrodes. They are in each case separated by means of planar semiconducting layers 131, 132 made up of organic material. These semiconducting layers 131, 132 can consist of molecules (molecule layer), but also of polymers.

The electrode, which is arranged adjacently to the substrate 11, can be termed the lower electrode. The counter electrode 123, which is furthest removed from the substrate, is also termed the upper electrode. Electrical potentials can be applied from outside at all three electrodes during operation.

The electrodes 121, 122, 123 of the vertical organic transistor are analogously to the bipolar transistor termed emitter, collector and base. Here, the central electrode 122 is always used as base. The electrode 121 and the counter electrode 123 can be used as emitter and collector or as collector and emitter. Emitter and collector are therefore interchangeable. The organic layer, which is applied on the emitter, is termed the emitter layer. The organic layer, which is applied on the collector, is termed the collector layer.

The base electrode preferably has the property of allowing a direct (touch) contact of collector layer and emitter layer.

Thus, the base electrode can have a grid structure, wherein the contact surfaces of collector layer and emitter layer are formed in the region of openings of the base electrode. A charge carrier movement from emitter layer to collector layer is possible through these openings, without passing electrically conductive electrode material of the base electrode (central electrode 122) itself, i.e. without being transported through the material of the central electrode 122. As the base electrode is an electrically conductive electrode in spite of the openings, the desired potential is present at every point of the base electrode.

By means of a suitable choice of the electrical potentials which are present at the three electrodes 121, 122, 123, an injection of charge carriers at the emitter can be created. These injected charge carriers are moved through the layer(s) closest to the emitter electrode (emitter layer) and can pass the openings of the base electrode, in order to thus reach the collector layer. A corresponding potential at the collector electrode ensures the removal of the charge carriers which have reached the collector layer. The vertical organic transistor is a unipolar component and can therefore be either electron-conductive or hole-conductive, which corresponds to a preferred conduction of charge carriers in the form of electrons or charge carriers in the form of holes. This results if, in the respective material, the charge carrier mobility for electrons/holes is larger than the charge carrier mobility for the other type of charge carriers (holes/electrons).

Furthermore, a unipolarity with respect to the charge carrier type can be achieved by means of the use of material combinations of electrode material and material of the organic layer, so that the possibility of injection of charge carriers of the type holes is suppressed in the case of an electron-conducting vertical organic transistor, or the injection of charge carriers of the type electrons is suppressed in the case of a hole-conducting vertical organic transistor.

The process in which the charge carriers (electrons or holes) starting from the electrode which is used as emitter can pass the base electrode and reach the opposite electrode (collector) is termed the transmission or passage of charge carriers. The charge carriers which have traversed the base electrode here cannot must not have reached the line statuses of the base electrode, so that no additional voltage is required for a renewed injection of the charge carriers from the base electrode into the adjacent collector layer. The charge carriers which have been transmitted through the base electrode form the transmission current. Its proportion of the originally injected current is termed transmission or transmission factor.

A doping layer 141 and a further doping layer 142 are provided in the vertical organic transistor in FIG. 1.

In the following, the term charge carrier, when not characterised otherwise, is used for those charge carriers which feature predominantly, that is to say electrons in the case of an electron-conducting (electron based) vertical organic transistor and holes in the case of a hole-conducting (hole based) vertical organic transistor.

By means of a suitable choice of the potentials at the three electrodes 121, 122, 123, the transmission current can be suppressed or induced. In the case of a maximum transmission current, the collector current likewise becomes very large and therefore defines the on state of the component. Ideally the current which flows in the base electrode in order to reach the on state should be smaller than the collector current in the on state. The ratio between collector current and base current can be termed as direct-current amplification. The off state is reached if, given a suitable choice of the potentials at the three electrodes 121, 122, 123, the transmission current becomes zero. The only current that the collector current can then reach is set by charge carriers injected from the base electrode into the adjacent collector layer. The current in the off state should ideally be as low as possible, for which reason the injection of charge carriers of the base electrode into the adjacent molecule layers is suppressed. The ratio between on state and off state is termed the on/off ratio and is an important characteristic variable of a transistor.

In one configuration, the semiconducting layer 131 and the doping layer 141 are formed with the same organic matrix material. Alternatively or additionally, the further semiconducting layer 132 and the further doping layer 142 are the same organic matrix material. In one design, the semiconducting layer 131 and the doping layer 141 are formed with different organic matrix materials. Alternatively or additionally, the organic matrix material of the doping layer 141 is essentially an amorphous material. Preferably, the matrix material of the doping layer 141 is a semiconductor from the class of diamines, which transports organic holes. One possible example for this is N,N'-bis(naphthalen-1-yl)-N,N'-bis(phenyl)-benzidine.

Figure 2:
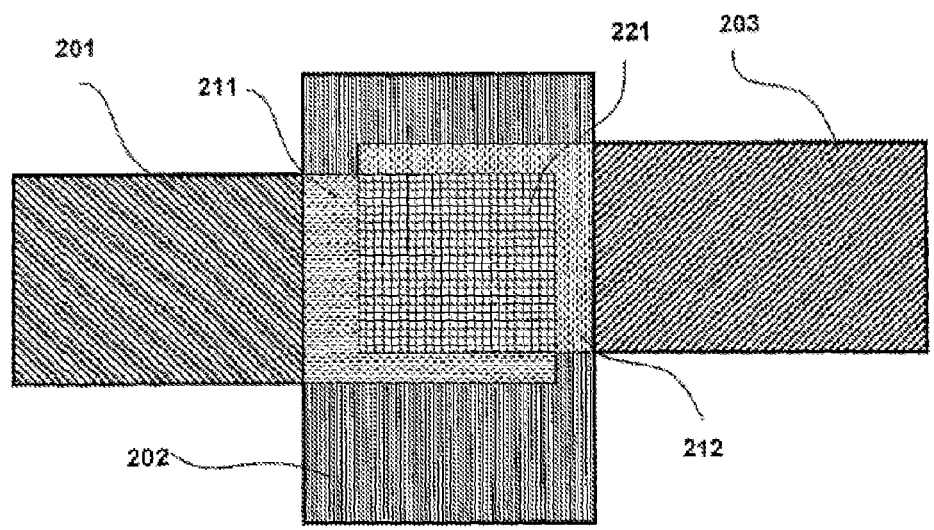
FIG. 2 shows a schematic illustration of a vertical organic transistor in a plan view.

The active surface 221 is shown in FIG. 2. It is defined by the overlap of the upper electrode 201, the central electrode 202 and the lower electrode 203. An overlap of upper electrode 201 and lower electrode 203 without central electrode 202 (missing overlap) should be avoided, as otherwise the currents between the two electrodes 201, 203 cannot be controlled and a reduction of the on/off ratio would be the consequence. A solution for this problem consists in enlarging the central electrode 202 beyond the active surface and thus also preventing a missing overlap within the tolerances of the structuring method also.

An overlap between upper electrode 201 and central electrode 202 without lower electrode (face 211 in FIG. 2) occurs as a consequent problem. If the upper electrode is available as emitter, charge carriers can only reach the opposite collector layer within the active surface. Within the surface 211, the transmission of charge carriers is not possible. The currents in this surface 211 are however entered in the balance sheet for the transmission factor. As the transmission factor is directly associated with the amplification of a vertical organic transistor, the currents in the surface 211 lead to a reduction of the amplification.

Furthermore, there is an overlap of lower electrode 203 and central electrode 202 without upper electrode 201 in the surface 212. If one in turn assumes that the upper electrode is the emitter, a current from the central electrode 202 to the lower electrode 203, which cannot be controlled and increases the current in the off state, arises in the surface 212. At the same time, no additional transmission current can be generated within this surface, so that the current in the on state through the surface 212 is not further increased. Consequently, there is a slight drop of the on/off ratio, which however drops clearly to a lesser extent than in the case of a missing overlap.

One property of the vertical organic transistor with the central electrode 122, which enables the direct contact of organic layer 131 and further organic layer 132, is the reaching through of the electrical field from the emitter to the collector through the openings 124 of the central electrode 122. Thus, the electrical field between electrode 121 and central electrode 122 can no longer be considered separately from the electrical field between counter electrode 123 and central electrode 122. A change of the potential at the collector can therefore lead to a change of the electrical current flow at the emitter contact. This effect is also termed back coupling.

An accumulation with free charge carriers can take place in the semiconductor by means of electrical doping. This is not just possible for inorganic semiconductors, but rather for organic semiconductors also. To this end, additional doping molecules (dopant) are introduced in a matrix molecule layer, which is responsible for the transport of the charge carriers. The layer created is termed a doping layer in the following. The principle of the doping mechanism is a partial charge carrier transfer of doping molecule onto the matrix molecules. In this case, in an n-doping additional electrons are liberated in the matrix molecule layer. In a p-doping, additional holes are liberated in the matrix molecule layer. The charge carriers which have been liberated during the doping processes can lead to the raising of the Fermi level (n-doping) or to lowering of the Fermi level (p-doping).

By approximating the Fermi level to the transport level of the organic semiconductor, the injection barrier for the corresponding charge carrier locations can be dropped considerably in the event of contact with metal. Consequently, the voltage loss at the injecting contact is minimised and the injection can be termed ohmic.

EXAMPLES

A vertical organic transistor was produced in a vacuum by means of thermal varporisation. The layers were applied on a cleaned glass substrate in the following sequence:

50 nm Al and subsequently 20 nm Au as counter electrode (lower electrode) 123.
100 nm $C_{60}$ as organic layer (lower molecule layer) 132.
15 nm Al as central electrode 122
100 nm $C_{60}$ as further organic layer (upper molecule layer) 132
20 nm C60 layer doped with N1,N4-bis(triphenylphosphoranylidene)benzene-1,4-diamine doped C60-layer (doping layer) 41
20 nm Au and subsequently 50 nm Al as electrode (upper electrode) 121

The doping layer used with doping in the samples consists of a 20 nm thick C60 layer, which is n-doped by means of co-vaporisation with the molecule N1,N4-bis (triphenylphosphoranylidene)benzene-1,4-diamine. The material W2(hpp)4 can alternatively also be used for n-doping. The proportion of doping molecules on the overall layer is 2% by weight.

The electrodes were structured with the aid of shadow masks. The overlap of the three electrodes defines the active surface 221.

After applying the central electrode 122, the sample is brought into the air for 15 min. Subsequently, the sample is again brought into the vacuum and the further layers can be processed. This step leads to the oxidation of the central electrode 122. The aluminium oxide which forms is an insulator which supports the control function of the central electrode.

After the production of the sample, the same is enclosed in a protective atmosphere by means of a glass capsule, in order to prevent a degradation of the component. After the encapsulation, the sample is baked out at 150° C. for two hours. This heating step is provided as it has been shown in experiments that the functionality of the base electrode then better proves its worth.

Figure 3:
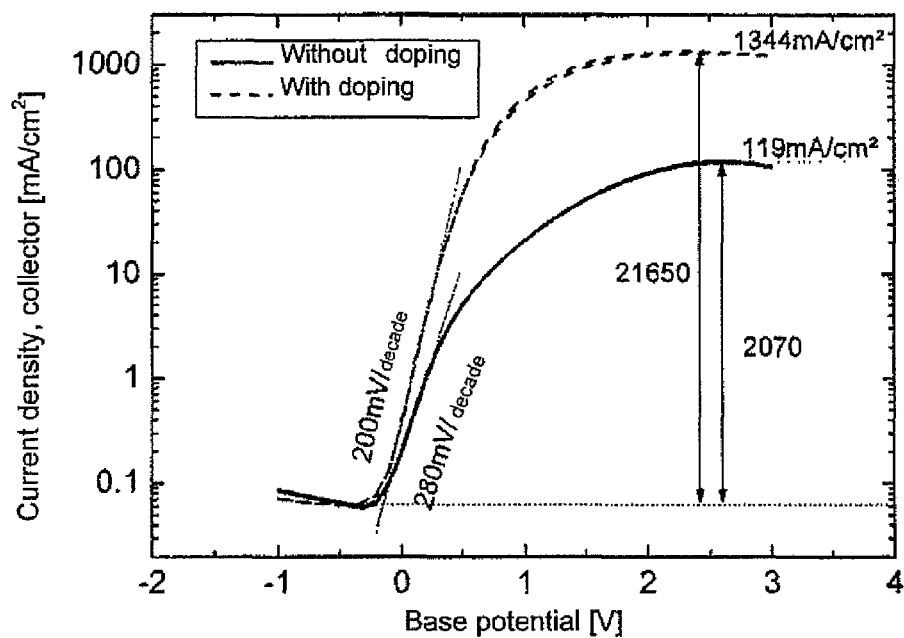
FIG. 3 shows a graphical illustration of the collector current as a function of base potential for a sample without and with doping layer on the emitter contact.

Shown in FIG. 3 is a basic runthrough for an operating voltage of 3 V between emitter and collector. For this, the upper electrode 121 is used as emitter in that a reference potential of 0 V is applied. The lower electrode 123 then acts as collector and receives a fixed potential of 3 V. The central electrode 122 takes on the function of the base. The potential of the base is then varied in order to generate an off state (−0.3 V) and an on state (~2-2.5 V). The measurement takes place from 0 V to 3 V. Subsequently, the measuring points are run through in reverse order.

Two samples are compared with one another. A first sample contains an upper doping layer (with doping), as described above. For comparison, a second sample is prepared without a doping layer 141 (without doping), which is identical in terms of construction in all other layers, as described above. As the upper electrode is used as emitter in the measurement for FIG. 3, doping is present in the sample with doping layer on the emitter.

The current density in the on state can be increased from 119 $mA/cm^2$ to 1344 $mA/cm^2$. This corresponds to an increase by more than a factor of 10. To be added to this is the fact that the current density already drops out comparatively high without doping.

The on/off ratio can be increased from 2070 to 21650, and is therefore larger by a factor of more than 10.

The increase of the current density with the change of the basic potential can be indicated by the voltage which is required to change the current by an order of magnitude. This value is called the "subthreshold swing". Due to the additional doping layer, the "subthreshold swing" can be reduced from 280 mV/decade to 200 mV/decade in the sample in FIG. 3. This corresponds to a reduction by 29%. This value should be as low as possible and in field effect transistors is typically less than 100 mV/decade.

Figure 4:
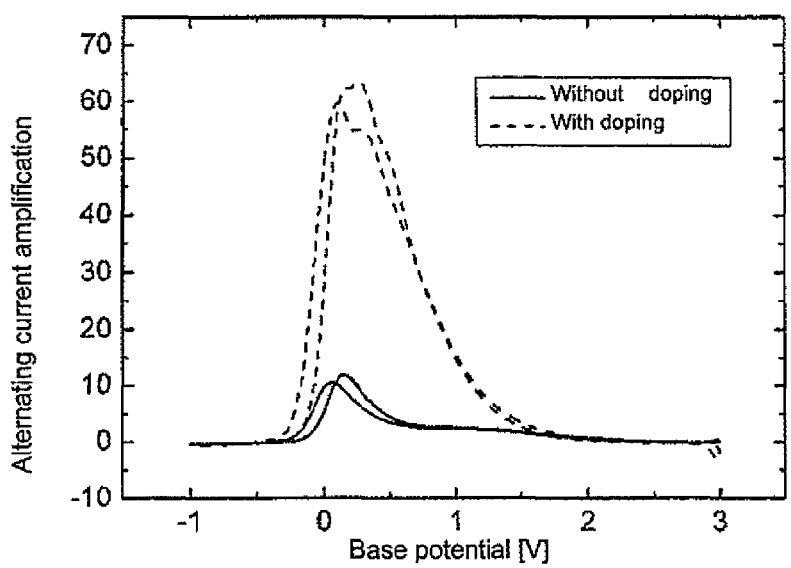
FIG. 4 shows a graphical representation of an alternating-current amplification as a function of base potential for the measurement in FIG. 3.

Illustrated in FIG. 4 is the alternating-current amplification for the measurement in FIG. 3. By inserting a doping layer, the maximum amplification can be increased by approximately a factor of 6. In addition, the alternating-current amplification drops between 0.5 V and 1.5 V substantially more slowly, so that even at high current densities in the on state, a higher current amplification is present.

The doping layer can not only improve function when introduced on the emitter contact, but rather also has a positive effect on the parameters of the transistor structure when introduced on the collector contact.

Figure 5:
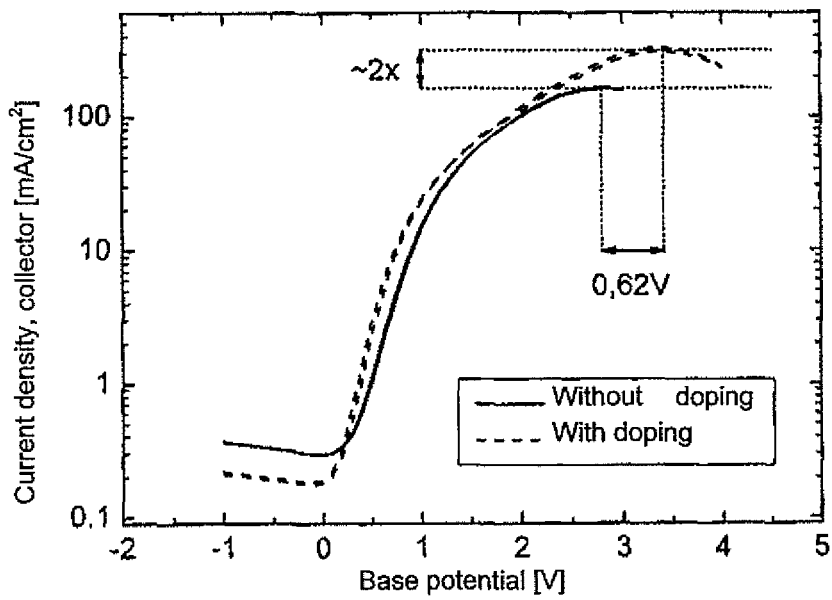
FIG. 5 shows a graphical illustration of the collector current as a function of base potential for a sample without and with doping layer on the collector contact.

The basic runthrough, as described in FIG. 3, is carried out in FIG. 5. A constant operating voltage of 3 V is applied between emitter electrode and collector electrode. However, the lower electrode 123 is then used as emitter electrode and the upper electrode 121 is used as collector electrode. As a result, the upper doping layer 141 is then located on the collector side.

FIG. 5 shows the basic runthroughs for two different samples. The first sample has no doping layer and is referred to with "without doping" and the second sample has a doping layer on the collector side and is referred to with "with doping".

The current density in the on state is in the case of a base potential of UB=3.4 V twice as large for the sample with doping than for a sample without doping, which reaches its on state at a base potential of approximately UB=2.8 V. As the collector potential in this measurement is fixedly at UC=3 V, a sample without doping reaches its maximum current if a voltage of 0.2 V is present between base electrode 122 and collector electrode. By contrast, a sample with doping only reaches its maximum current if a voltage of −0.4 V is present between base electrode 122 and collector electrode. Consequently, with doping, charge carriers can still be transmitted, even if a negative field voltage is present between base electrode 122 and collector electrode.

One can understand this by means of the formations of an integral voltage in the molecule layer between the base electrode 122 and collector electrode. This integrated voltage occurs if a charge carrier exchange with the environment takes place (for example with the metallic electrodes) due to the charge carrier excess within the doping layer. This integrated voltage is orientated such that it positively influences the transmission process and the resulting electrical field benefits the charge carrier transport of charge carriers transmitted through the base electrode 122 to the collector. In order to suppress this effect, a negative field voltage must be applied between base electrode 122 and collector electrode, as is necessary in FIG. 5 for the sample with doping.

Figure 6:
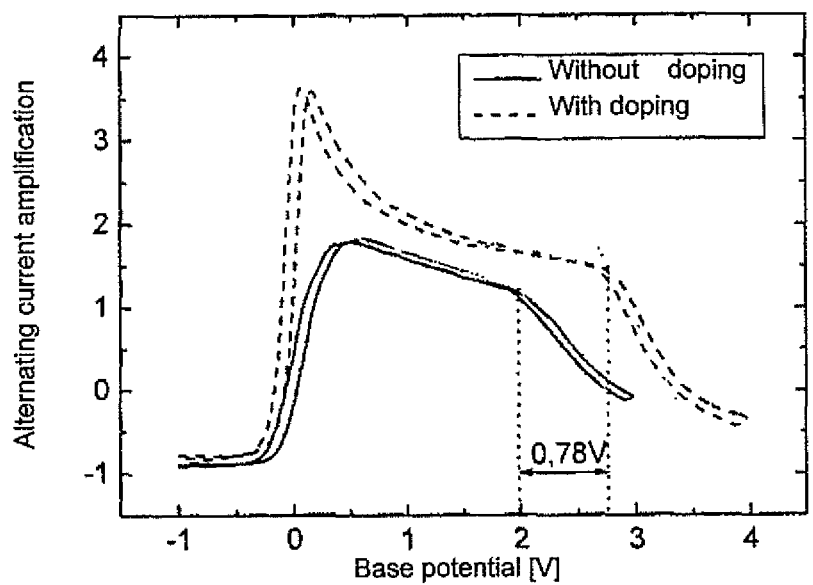
FIG. 6 shows a graphical representation of the alternating-current amplification as a function of base potential for the measurement in FIG. 5.

The alternating current amplification of the samples, calculated over the basic runthrough in FIG. 5, is illustrated in FIG. 6. The alternating current amplification is related to the transmission of the charge carriers by through the base electrode due to the excess of charge carriers 122 and is the larger it is, the larger is the transmission.

The sample with doping has a pronounced peak in the alternating current amplification in the region of approximately UB=0.1 V to UB=0.2 V. This behaviour cannot be seen for a comparison sample without doping.

Furthermore, the alternating current amplification is larger over the entire measuring range than for a sample without doping.

The most important difference between the samples consists in the voltage from which the alternating current amplification drops at larger base potentials. It can be seen here that the sample without doping has clearly lost more in terms of alternating current amplification. In the sample with doping, this voltage is approximately 0.78 V higher and thus the sample with doping reaches the on state not only with a higher current intensity, but also with a higher alternating current amplification. In FIG. 6, in the case of a base potential of approximately UB=2.7 V, the alternating current amplification has already fallen to 0 in the case of a sample without doping and thus no longer shows any amplification. The sample with doping still has an alternating current amplification of greater than 1 however.

At an operating voltage of 3 V and a shift of the amplification drop by 0.78 V, this corresponds to an improvement of 26%.

The doping at the collector can consequently be used for two purposes. Either it will increase the amplification of the component at high current densities in the case of a constant operating voltage, or in the case of constant amplification, the operating voltage and thus also the power consumption can be dropped.

The features of the invention disclosed in the previous description, the claims and the drawing can be of importance both individually and in any desired combination for realising the invention in its various configurations.

The invention claimed is:

1. A vertical organic transistor, on a substrate, comprising:
   an electrode,
   a counter electrode, and
   a layer arrangement which is arranged between the electrode and the counter electrode,
   wherein the layer arrangement comprises the following layers:
   a central electrode, which allows a passage of electrical charge carriers through the central electrode, which are injected from the electrode into the layer arrangement, so that the injected electrical charge carriers can be transported from the electrode through the layer arrangement to the counter electrode,
   a first organic layer of a first organic semiconductor material which is arranged between the central electrode and the electrode,
   a second organic layer of a second organic semiconductor material, which is arranged between the central electrode and the counter electrode, and
   a first doping layer which is arranged between the central electrode and the electrode, and wherein the central electrode has one or a plurality of openings, through which a touch contact is made between a first region of the layer arrangement on one side of the central electrode and a second region of the layer arrangement on an opposite side of the central electrode.

2. The transistor according to claim 1, wherein the first doping layer is arranged between the electrode and the first organic layer.

3. The transistor according to claim 1, further comprising a second doping layer, which is arranged between the central electrode and the counter electrode.

4. The transistor according to claim 3, wherein the second doping layer is arranged between the counter electrode and the second organic layer.

5. The transistor according to claim 3, wherein the first doping layer or the second doping layer is formed as an electrically doped layer, in which an electrical dopant is embedded into a matrix material.

6. The transistor according to claim 3, wherein the first doping layer or the second doping layer is formed as a dopant layer made up of a doping material, wherein the doping material is an electrical dopant for the first organic semiconductor material of the first organic layer in the case of the first doping layer and an electrical dopant for the second organic semiconductor material of the second organic layer in the case of the second doping layer.

7. The transistor according to claim 3, wherein the first doping layer and the second doping layer differ with respect to at least one of the following layer properties:
   layer thickness,
   spacing between a layer edge facing the central electrode and an opposite layer edge of the central electrode,
   doping profile, and
   material composition.

8. The transistor according to claim 3, wherein at least one of the following layers is multilayered: the first organic layer, the second organic layer, the first doping layer, and the second doping layer.

* * * * *